United States Patent [19]
Hiiro

[11] Patent Number: 6,163,558
[45] Date of Patent: Dec. 19, 2000

[54] LASER SYSTEM FOR ROTATING AMPLITUDE DISTRIBUTION OF OUTPUT LIGHT

[75] Inventor: Hiroyuki Hiiro, Kanagawa-ken, Japan

[73] Assignee: Fuji Photo Film Co., Ltd., Kanagawa-Ken, Japan

[21] Appl. No.: 09/305,694

[22] Filed: May 5, 1999

[30]     Foreign Application Priority Data

May 6, 1998   [JP]   Japan ................................. 10-123301

[51] Int. Cl.[7] ........................................................ H01S 3/08
[52] U.S. Cl. ............................. 372/99; 372/105; 372/106
[58] Field of Search ................................ 372/92, 98, 99, 372/101, 105, 106, 100, 102

[56]              References Cited

U.S. PATENT DOCUMENTS

| | | | |
|---|---|---|---|
| 5,018,153 | 5/1991 | Chien et al. | 372/105 X |
| 5,185,752 | 2/1993 | Welch et al. | 372/102 X |
| 5,233,620 | 8/1993 | Shinozaki et al. | 372/100 X |
| 5,452,312 | 9/1995 | Yamamoto et al. | 372/102 X |

OTHER PUBLICATIONS

IEEE J. Quantum Electronics, vol. QE–8, No. 7, Jul. 1972, pp. 632–641, "High–Radiance Room–Temperature GaAs Laser with Controlled Radiation in a Single Transverse Mode", Philipp–Rutz, E.

Appl. Phys. Lett., 54(18), May 1, 1989, pp. 1731–1733, "High–Power, Diffraction–Limited, Narrow–Band, External–Cavity Diode Laser", Sharfin, W. F. et al.

Optics Letters, vol. 17, No. 12, Jun. 15, 1992, pp. 859–861, "Flattening of the Spatial Laser Beam Profile with Low Losses and Minimal Beam Divergence", Kermene, V. et al.

Optics Letters, vol. 19, No. 23, Dec. 1, 1994, pp. 1976–1978, "High Modal Discrimination in a Nd:YAG Laser Resonator with Internal Phase Gratings", Leger, J. R. et al.

Appl. Phys. Lett., 66(13), Mar. 27, 1995, pp. 1614–1616, "Large–Area, Single–Transverse–Mode Semiconductor Laser with Diffraction–Limited Super–Gaussian Output", Mowry, G. et al.

SPIE, vol. 2889, (No Month), 1996, pp. 410–416, "Laser Mode Control Using an Inverse External Cavity", Shih, C.C.

*Primary Examiner*—John D. Lee
*Attorney, Agent, or Firm*—Sughrue, Mion, Zinn, Macpeak & Seas, PLLC

[57]                ABSTRACT

A laser system includes a light amplifier medium provided with an optical waveguide layer which controls the transverse mode to a fundamental transverse mode in one direction, a first resonator mirror optical system which is opposed to a first light outlet end face of the light amplifier medium and reflects a laser beam radiated from the first light outlet end face to impinge upon the first light outlet end face, and a second resonator mirror optical system which is opposed to a second light outlet end face of the light amplifier medium and reflects a laser beam radiated from the second light outlet end face to impinge upon the second light outlet end face. At least one of the first and second resonator mirror optical system includes a collimator optical system which collimates the amplitude distribution in the laser beam radiated from the corresponding light output end face of the light amplifier medium at least in a direction substantially perpendicular to the optical waveguide layer, and a reflecting optical system which converts amplitude distribution in the direction substantially perpendicular to the optical waveguide layer in the collimated laser beam to amplitude distribution in a direction substantially parallel to the optical waveguide layer and reflects the laser beam.

8 Claims, 8 Drawing Sheets

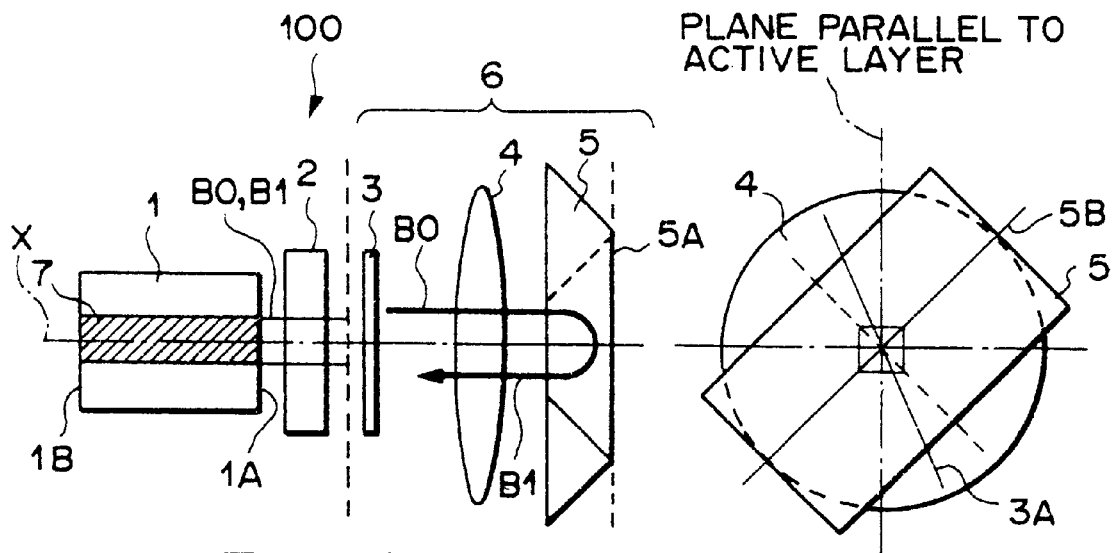
FIG. 1A
FIG. 1C
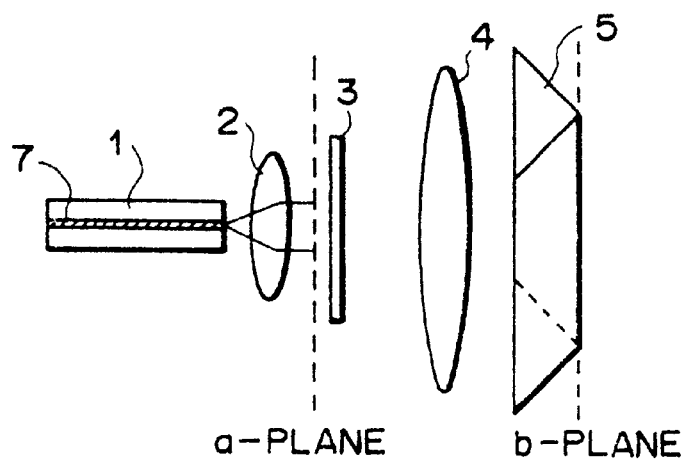
FIG. 1B

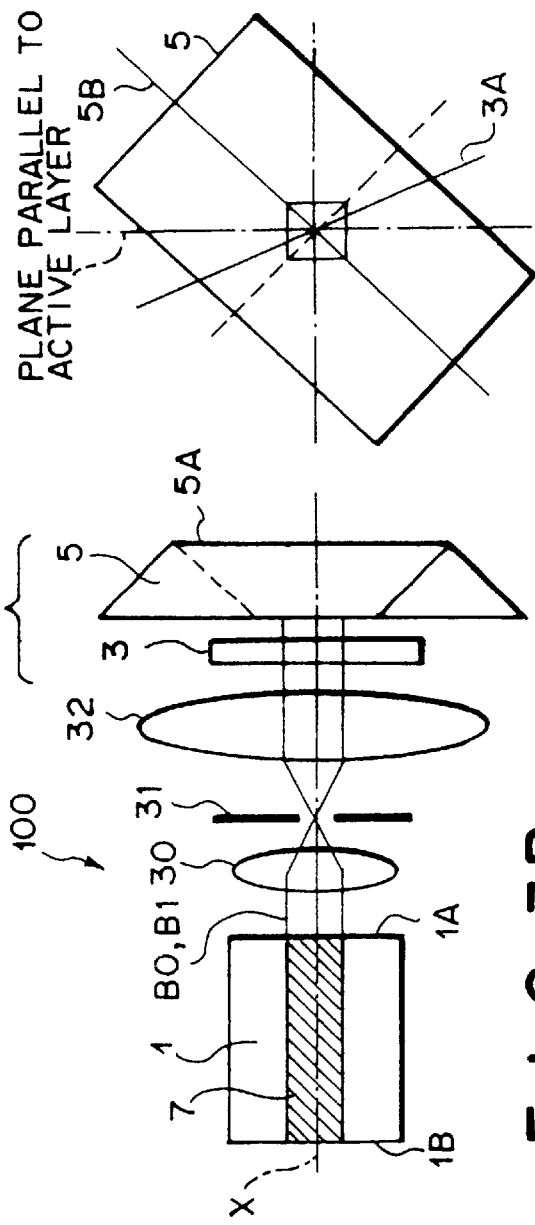
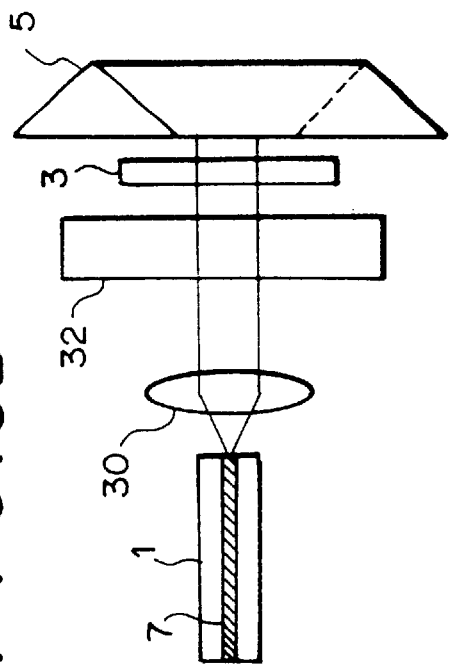

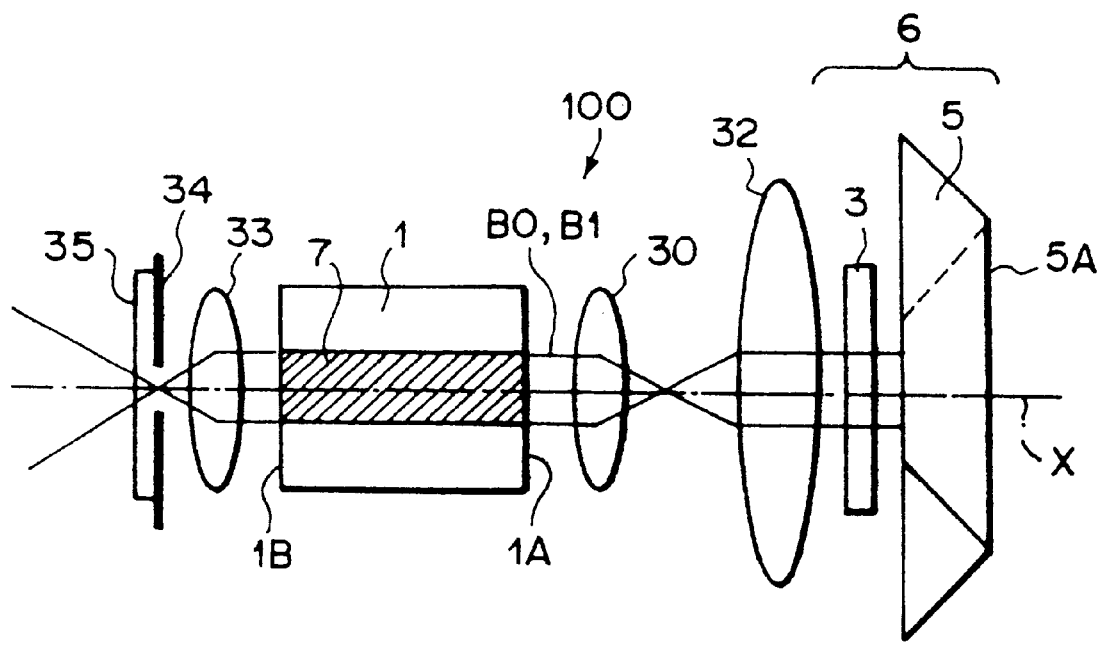
F I G . 4

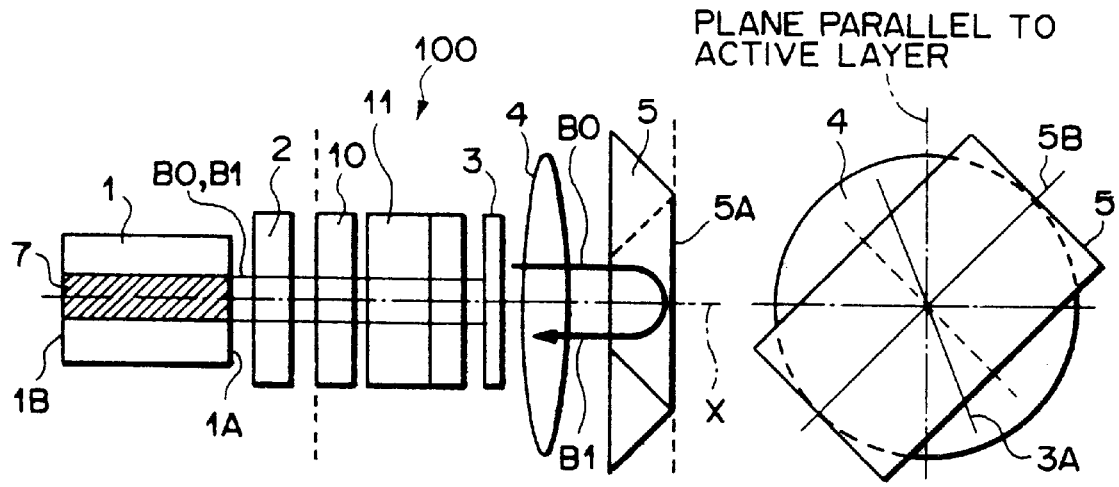
FIG. 5A
FIG. 5C
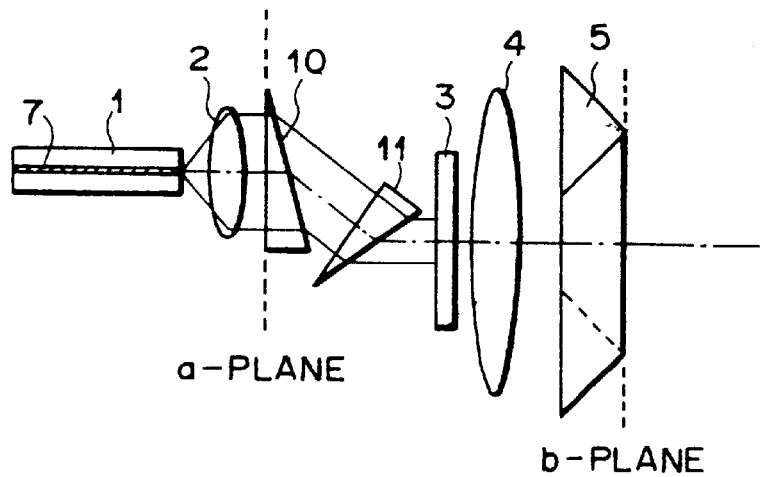
FIG. 5B

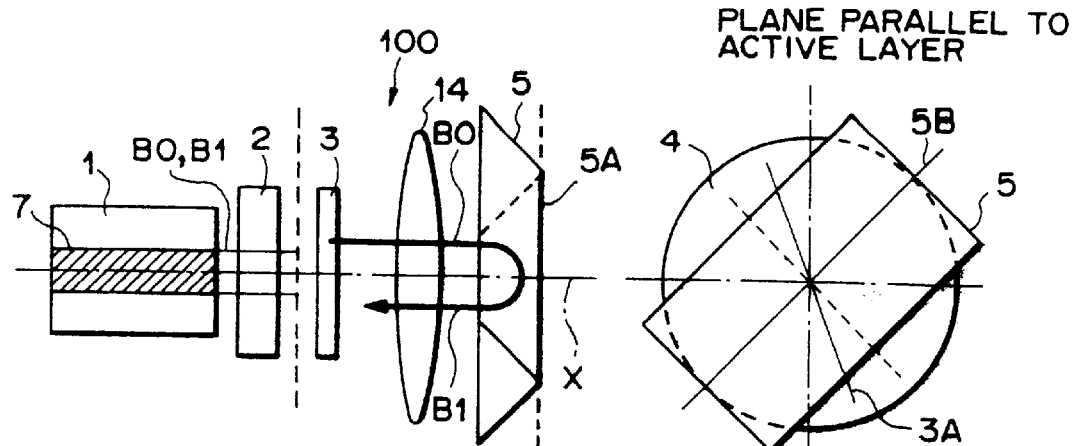
FIG. 6A
FIG. 6C
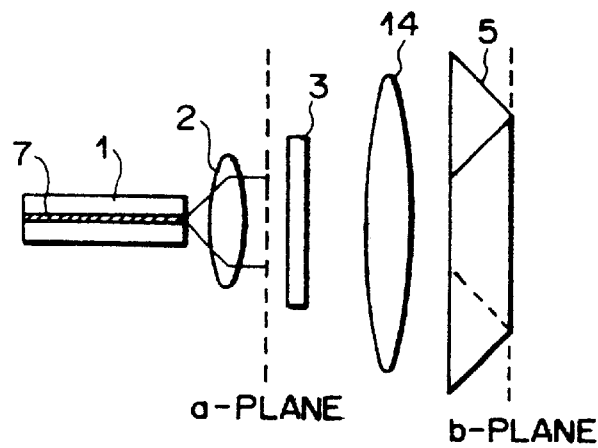
FIG. 6B
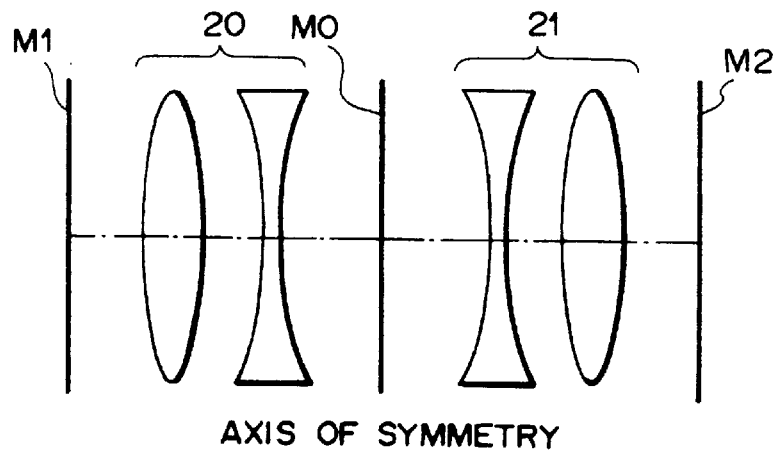
FIG. 7 a-PLANE   b-PLANE

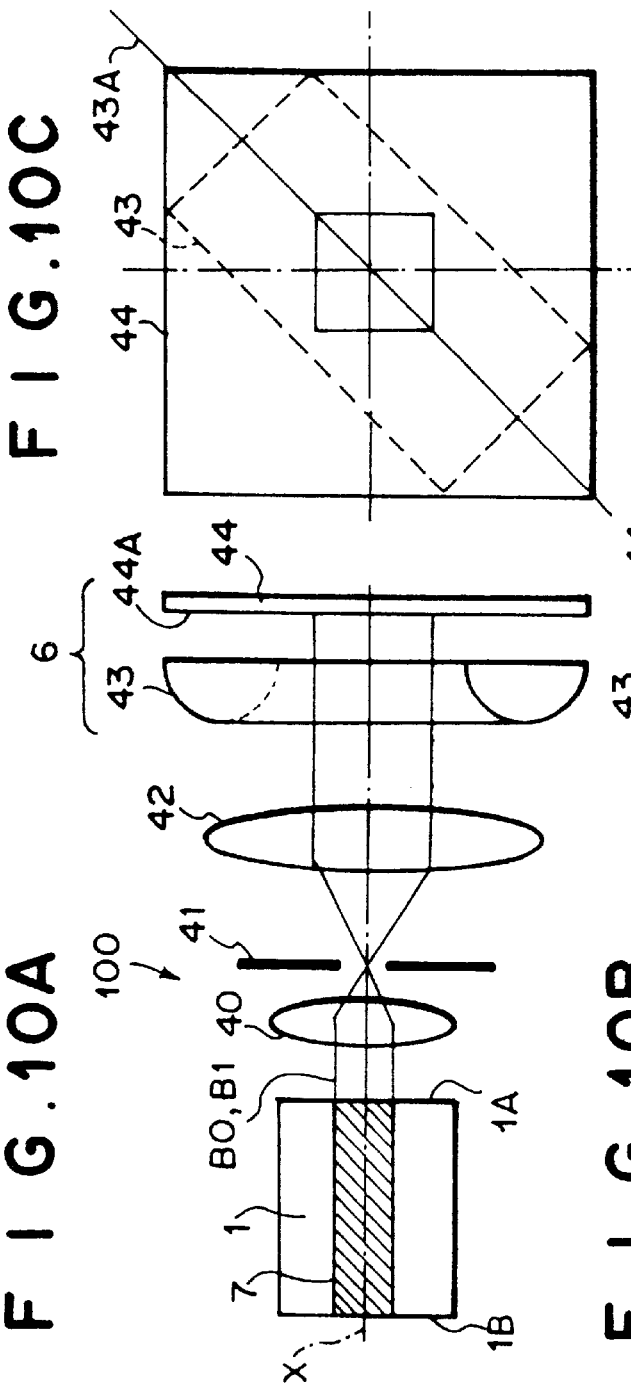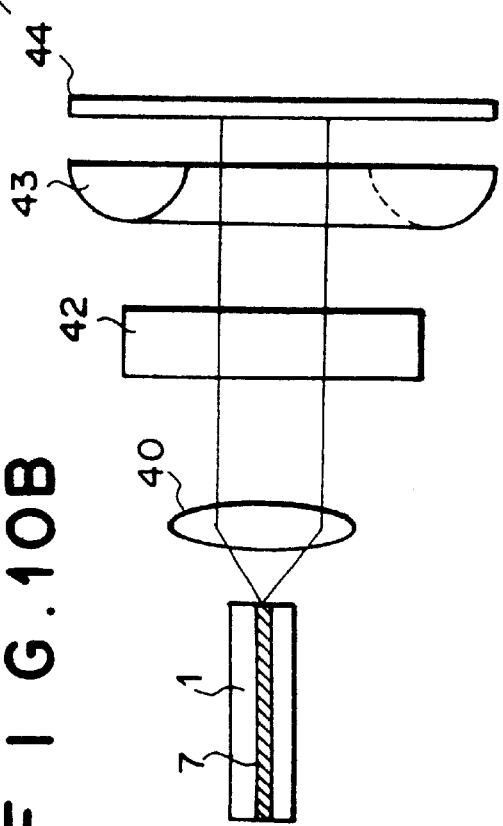

LASER SYSTEM FOR ROTATING AMPLITUDE DISTRIBUTION OF OUTPUT LIGHT

BACKGROUND OF THE INVENTION

1. Field of the Invention

This invention relates to a laser system such as a broad area semiconductor laser, a phase-locked semiconductor laser or an optical waveguide type laser which uses a light amplifier medium having a transverse mode control mechanism comprising an optical waveguide layer which controls the transverse mode in one direction, and more particularly to a laser system in which oscillation in only a fundamental transverse mode is efficiently obtained.

2. Description of the Related Art

Lasers have been employed as a light source for a scanner in various fields such as a scanner for recording information on a recording medium or reading information recorded on a recording medium, and there is a demand for a higher output laser.

As a method of increasing the output power of a laser, there has been known a method in which the active area or the oscillation mode volume of the light amplifier medium is increased. For example, the area in the transverse direction of the light amplifier medium may be increased or gain of the light amplifier medium may be increased.

This approach will generally encounter the difficulty that a plurality of high order transverse modes are generated and it is impossible to obtain a single transverse mode. Accordingly the emitted laser beam cannot be condensed to a diffraction limit and the power density of the condensed laser beam cannot be increased with increase in the oscillation output power. This problem is remarkable especially in semiconductor lasers which are high in gain. As a high output semiconductor laser, there has been known a broad area semiconductor laser in which the width of the active area is enlarged. However since, in the broad area semiconductor laser, the resonator is not provided with modal discrimination function to cause oscillation in a single transverse mode, a plurality of high order transverse modes are simultaneously generated and accordingly the emitted laser beam cannot be condensed to a diffraction limit and a beam spot of high power density cannot be obtained.

In order to enhance modal discrimination to overcome these problems, there have been proposed various resonator structures as follows.

1) Space Filter System

There has been known a system in which only a lowest order fundamental transverse mode is effectively oscillated by increasing loss in high order modes by providing a space filter, comprising a lens and a simple opening, in the resonator. See, for instance, "High-Radiance Room-Temperature GaAs Laser With Controlled Radiation in a Single Transverse Mode" (E. M. Phillip-Rutz, IEEE J. Quantum Electron QE-8, 632(1972)), "High-power, diffraction-limited, narrow-band, external-cavity diode laser" (W. F. Sharfin, J. Seppala, A. Mooradian, B. A. Soltz, R. G. Waters, B. J. Vollmer, and K. J. Bystrom Appl. Phys. Lett. 54, 1731(1989)), PCT Japanese Publication No. 4(1992)-504930, and "Flattening of the spatial laser profile with low losses and minimal beam divergence" (V. Kermene, A. Saviot, M. Vamppouille, B. Colombeau, C. Froehly, and T. Dohnalik, Opt. Lett. 17,859(1991)).

However in such a laser, since a simple opening is employed, high order mode spatial frequency components cannot be expelled from the resonator though loss in high order modes can be relatively increased. Accordingly, when loss is increased and gain is enhanced, natural oscillation mode of the resonator can be obtained, and as a result, oscillation in high order modes cannot be suppressed in light amplifier media having sufficiently high gain such as semiconductor lasers and a plurality of high order transverse modes are generated as well as a fundamental transverse mode.

2) Mode Selective Mirror System

There has been known a system in which only a desired spatial mode is caused to oscillate by use of a resonator mirror having mode selectivity. As a laser employing this system, there has been known, for instance, a diffraction type mode selective mirror system laser. See, for instance, "High modal discrimination in a Nd:YaG laser resonator with internal phase gratings" (J. R. Leger, D. Chen, and K. Dai, Opt/ Lett. 19, 1976(1994)) and "Large-area, single-transverse-mode semiconductor laser with diffraction-limited super-Gaussian output", (G. Mowry, and J. R. Leger, Appl. Phys. Lett. 66,1614(1995)). However, this system involves the problems similar to those in the space filter system.

3) Inverse External Cavity System

There has been known a system in which the phase of a laser beam radiated from a light amplifier medium is inverted and the inverted phase laser beam is reintroduced into the light amplifier medium. See, for instance, "Laser mode control using an inverse external cavity", (C. C. Shih, SPIE Proceedings 2889,410, (1996)). Also in this system, it is not possible to cause only the fundamental transverse mode to effectively oscillate since oscillation in even high order transverse modes cannot be suppressed though oscillation in odd high order transverse modes can be suppressed.

As can be understood from the description above, in accordance with the prior arts, though the laser system using a laser medium having a wide active area or a large oscillation mode volume can be increased in its output power, it cannot radiate a high quality laser beam oscillating only in a fundamental transverse mode. Accordingly, when the output power is increased, the emitted laser beam cannot be condensed to a diffraction limit, which makes it difficult to obtain a high power density.

SUMMARY OF THE INVENTION

In view of the foregoing observations and description, the primary object of the present invention is to provide a laser system which can oscillate only a fundamental transverse mode, thereby radiating a high quality laser beam at high output power.

In accordance with the present invention, there is provided a laser system comprising a light amplifier medium provided with an optical waveguide layer which controls the transverse mode to a fundamental transverse mode in one direction, a first resonator mirror optical system which is opposed to a first light outlet end face of the light amplifier medium and reflects a laser beam radiated from the first light outlet end face to impinge upon the first light outlet end face, and a second resonator mirror optical system which is opposed to a second light outlet end face of the light amplifier medium and reflects a laser beam radiated from the second light outlet end face to impinge upon the second light outlet end face, wherein the improvement comprises that at least one of the first and second resonator mirror optical system comprises
- a collimator optical system which collimates the amplitude distribution in the laser beam radiated from the corresponding light output end face of the light amplifier medium at least in a direction substantially perpendicular to the optical waveguide layer, and
- a reflecting optical system which converts amplitude distribution in the direction substantially perpendicular to the optical waveguide layer in the collimated laser beam to amplitude distribution in a direction substantially parallel to the optical waveguide layer and reflects the laser beam.

Each of the first and second resonator mirror systems may be provided separately from the light amplifier medium or may comprise the light outlet end face of the light amplifier medium which is arranged to function as a mirror.

It is preferred that the reflecting optical system comprises an inverting mirror optical system which reflects the laser beam collimated by the collimator optical system with its amplitude distribution inverted substantially by 180° about an axis which is substantially at 90° to the optical axis of the laser beam and at 45° to a normal of the optical waveguide layer.

Specifically it is preferred that the inverting mirror optical system comprises
- a λ/2 plate which makes the direction of polarization of the laser beam as radiated from the light amplifier medium substantially equal to that of the laser beam entering the light amplifier medium, and
- a right-angle prism mirror which reflects the laser beam collimated by the collimator optical system with its amplitude distribution inverted substantially by 180° about an axis which is substantially at 90° to the optical axis of the laser beam and at 45° to a normal of the optical waveguide layer.

In one embodiment, the inverting mirror optical system comprises
- a λ/2 plate which makes the direction of polarization of the laser beam as radiated from the light amplifier medium substantially equal to that of the laser beam entering the light amplifier medium,
- a Fourier transform lens which subjects the laser beam collimated by the collimator optical system to Fourier transform, and
- a right-angle prism mirror which reflects the laser beam subjected to the Fourier transform by the Fourier transform lens with its amplitude distribution inverted substantially by 180° about an axis which is substantially at 90° to the optical axis of the laser beam and at 45° to a normal of the optical waveguide layer.

In this case, it is preferred that the Fourier transform lens is an in-mirror type Fourier transform lens whose focal length f satisfies the condition represented by the following formula;

$$D1 \times D2 = K \times \lambda \times f$$

wherein D1 represents the beam diameter of the laser beam at a focal plane of the in-mirror type Fourier transform lens as measured in the direction perpendicular to the optical waveguide layer, D2 represents the beam diameter of the laser beam at the focal plane of the in-mirror type Fourier transform lens as measured in the direction parallel to the optical waveguide layer, K is a constant of proportionality determined depending on the shape of the beam, the aperture of the lens and the like, λ represents the wavelength of the laser beam, and f represents the focal length.

In another embodiment of the present invention, the inverting mirror optical system comprises a cylindrical lens having power in the direction substantially at 45° to a normal of the optical waveguide layer, and a mirror disposed near the focal point of the cylindrical lens. In this case, the inverting mirror optical system may further comprise a Fourier transform lens which subjects the laser beam collimated by the collimator optical system to Fourier transform.

In the latter case, it is preferred that the Fourier transform lens is an in-mirror type Fourier transform lens whose focal length f satisfies the condition represented by the following formula;

$$D1 \times D2 = K \times \lambda \times f$$

wherein D1 represents the beam diameter of the laser beam at a focal plane of the in-mirror type Fourier transform lens as measured in the direction perpendicular to the optical waveguide layer, D2 represents the beam diameter of the laser beam at the focal plane of the in-mirror type Fourier transform lens as measured in the direction parallel to the optical waveguide layer, K is a constant of proportionality determined depending on the shape of the beam, the aperture of the lens and the like, λ represents the wavelength of the laser beam, and f represents the focal length.

Further it is preferred that the reflecting optical system comprises an optical system which reflects the laser beam collimated by the collimator optical system with its amplitude distribution inverted substantially by 90° about the optical axis of the laser beam.

In the laser system of the present invention, the laser beam entering the resonator mirror optical system is reflected by the optical system to enter the light amplifier medium with its amplitude distribution in the direction substantially perpendicular to the optical waveguide layer converted to an amplitude distribution in the direction substantially parallel to the optical waveguide layer. Accordingly, for instance, the laser beam having an amplitude distribution controlled to a fundamental transverse mode in the direction substantially perpendicular to the optical waveguide layer when radiated from the light amplifier medium comes to have an amplitude distribution controlled to a fundamental transverse mode in the direction substantially parallel to the optical waveguide layer when it is reflected by the resonator mirror optical system to enter the light amplifier medium. Thus the amplitude distribution in one direction in the laser beam radiated from the light amplifier medium is forced to be in the fundamental transverse mode when the laser beam is reflected by the resonator mirror optical system, and accordingly, amplification and oscillation of high order transverse modes are prevented, whereby only the fundamental transverse mode is amplified and caused to oscillate.

Accordingly, in the laser system of this embodiment, a laser beam including only the fundamental transverse mode can be effectively oscillated and a high quality laser beam can be obtained at a high output power, whereby the radiated laser beam can be condensed to the diffraction limit, and a high power density can be obtained.

BRIEF DESCRIPTION OF THE DRAWINGS

FIG. 1A is a plan view of a laser system in accordance with a first embodiment of the present invention, FIG. 1B is a front view of the laser system, FIG. 1C is a right side view of the laser system, FIG. 3A is a plan view of a laser system in accordance with a third embodiment of the present invention, FIG. 3B is a front view of the laser system, FIG. 3C is a right side view of the laser system, FIG. 4 is a plan view of a laser system in accordance with a fourth embodiment of the present invention, FIG. 5A is a plan view of a laser system in accordance with a fifth embodiment of the present invention, FIG. 5B is a front view of the laser system, FIG. 5C is a right side view of the laser system, FIG. 6A is a plan view of a laser system in accordance with a sixth embodiment of the present invention, FIG. 6B is a front view of the laser system, FIG. 6C is a right side view of the laser system, FIG. 7 is a view showing a symmetric Fourier transform lens, FIG. 10A is a plan view of a laser system in accordance with a seventh embodiment of the present invention, FIG. 10B is a front view of the laser system, and FIG. 10C is a right side view of the laser system.

DESCRIPTION OF THE PREFERRED EMBODIMENTS

Figures 2A, 2C:
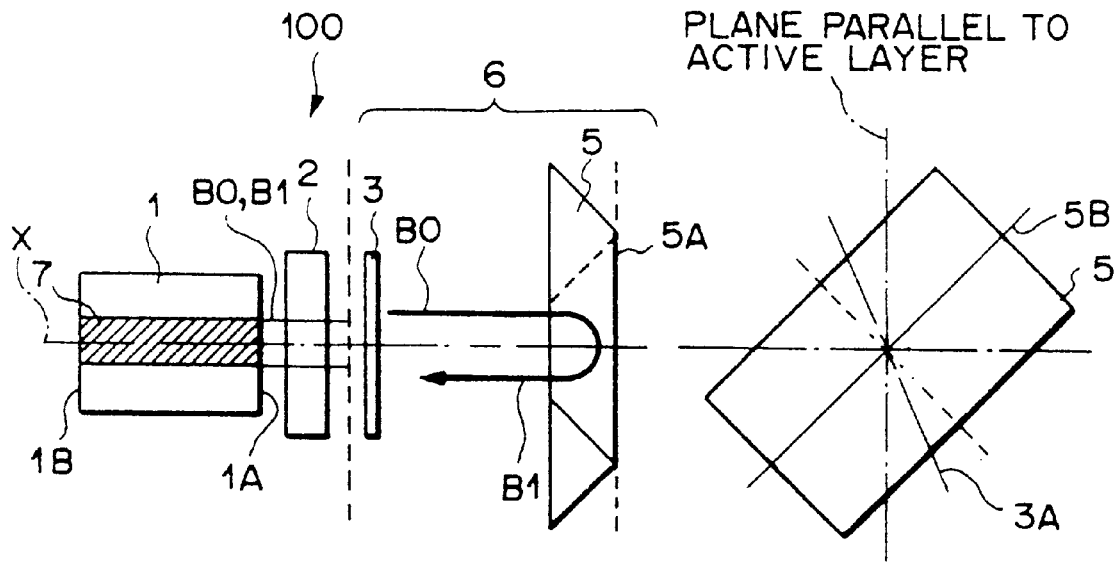
FIG. 2A is a plan view of a laser system in accordance with a second embodiment of the present invention.
FIG. 2C is a right side view of the laser system.

In FIGS. 1A to 1C, a laser system 100 in accordance with a first embodiment of the present invention comprises a broad-area semiconductor laser 1 as a light source, a cylindrical lens 2 disposed near a right side light outlet end face 1A of the semiconductor laser 1, a λ/2 plate 3 which rotates the direction of polarization of a laser beam Bo passing through the cylindrical lens 2, a Fourier transform lens 4 which prevents divergence of the laser beam Bo passing through the λ/2 plate 3, and a right-angle prism mirror 5 which reflects at a predetermined reflectance the laser beam Bo passing through the Fourier transform lens 4 while rotating amplitude distribution of the reflected laser beam B1 by 180° about an axis which is at 90° to an optical axis X and at 45° to a normal of an active layer 7 (to be described later). The cylindrical lens 2 forms the aforesaid collimator optical system, and the λ/2 plate 3, the Fourier transform lens 4 and the right-angle prism mirror 5 form a resonator mirror optical system 6.

The right side light outlet end face 1A of the broad-area semiconductor laser 1 is provided with AR (antireflection) coating and the left side light outlet end face 1B is provided with a LR (low reflection coating) which is several % in reflectance. The active layer (optical waveguide layer) 7 of the broad-area semiconductor laser 1 is wider in the horizontal direction (in the vertical direction as seen in FIG. 1A). In this particular embodiment, the direction in which the active layer 7 is wider is taken as the direction parallel to the active layer 7 and the direction in which the active layer 7 is narrow, that is, the vertical direction as seen in FIG. 1B, is taken as the direction perpendicular to the active layer 7. In the broad-area semiconductor laser 1 of this embodiment, the laser beam Bo is radiated by controlling the transverse mode in the direction perpendicular to the active layer 7 to a fundamental mode by the active layer 7. In the laser beam Bo as radiated from the broad-area semiconductor laser 1, the components in the direction parallel to the active layer 7 form parallel light and the components in the direction perpendicular to the active layer 7 form divergent light. The broad-area laser 1 has amplitude distribution symmetrical about the optical axis X in both the directions parallel to the active layer 7 and perpendicular to the active layer.

The cylindrical lens 2 has power only in the direction perpendicular to the active layer 7, and as shown in FIG. 1B, only the components of the laser beam Bo as radiated from the broad-area semiconductor laser 1 which are perpendicular to the active layer 7 are collimated by the cylindrical lens 2. The focal length of the cylindrical lens 2 is set so that the beam diameters as measured in the direction perpendicular to the active layer 7 and in the direction parallel to the active layer 7 at the back focal plane of the cylindrical lens 2 (a-plane) are substantially equal to each other. Accordingly at the a-plane, the laser beam Bo is substantially square in shape. In this embodiment, the beam diameter as measured in the direction parallel to the active layer 7 is a value when the laser beam oscillates in the fundamental transverse mode in the direction parallel to the active layer 7 and which of the focal planes is back or front is determined on the basis of the direction of travel of the laser beam Bo.

The Fourier transform lens 4 is disposed so that its front focal plane coincides with the a-plane. The Fourier transform lens 4 prevents the laser beam Bo from diverging.

The right-angle prism mirror 5 is disposed so that its reflecting surface 5A coincides with the back focal plane of the Fourier transform lens 4 (b-plane) and its edge 5B is at 45° to the direction parallel to the active layer 7 in a plane perpendicular to the optical axis X as shown in FIG. 1c. Accordingly, the amplitude distribution of the laser beam Bo reflected by the reflecting surface 5A of the right-angle prism mirror 5 is inverted by 180° about the edge 5B. That is, the amplitude distributions in the directions parallel and perpendicular to the active layer 7 in the laser beam Bo respectively correspond to those in the directions perpendicular and parallel to the active layer 7 in the reflected laser beam B1.

The λ/2 plate 3 is disposed so that its principal axis 3A is at 22.5° to the direction parallel to the active layer 7 and makes the direction of polarization of the laser beam Bo as radiated from the broad-area semiconductor laser 1 equal to that of the laser beam B1 reflected by the right-angle prism mirror 5 to impinge upon the broad-area semiconductor laser 1. That is, though the direction of polarization of the laser beam Bo as radiated from the semiconductor laser 1 is parallel to the active layer 7, the direction of polarization of the laser beam Bo is rotated by 45° (22.5°×2) when the laser beam Bo passes through the λ/2 plate 3 and becomes perpendicular to the edge 5B of the right-angle prism mirror 5 as shown by the broken line in FIG. 1C. Since the direction of polarization is kept unchanged while the laser beam is reflected twice by the right-angle prism mirror 5, the direction of polarization of the laser beam B1 reflected by the prism mirror 5 is equal to that of the laser beam Bo entering the prism mirror 5. Further since the λ/2 plate 3 is a reversible element, the direction of polarization of the laser beam B1 is rotated to be parallel to the active layer 7 when the laser beam B1 passes through the λ/2 plate 3. Accordingly, the direction of polarization of the laser beam Bo radiated from the broad-area semiconductor laser 1 and that of the laser beam B1 entering the semiconductor laser 1 are both parallel to the active layer 7.

The operation of the laser system 100 of the first embodiment will be described hereinbelow.

The laser beam Bo radiated from the AR-coated light outlet end face 1A of the broad-area semiconductor laser 1 is controlled so that the amplitude distribution in the direction perpendicular to the active layer is in the fundamental transverse mode. Further the laser beam Bo is parallel light in the direction parallel to the active layer 7 and is divergent light in the direction perpendicular to the active layer 7. The laser beam Bo is collimated only in the direction perpendicular to the active layer 7 by the cylindrical lens 2. Accordingly, the beam diameters as measured in the directions parallel and perpendicular to the active layer 7 become equal to each other at the back focal plane of the cylindrical lens 2 (the a-plane). The laser beam Bo thus shaped is rotated by 45° by the λ/2 plate 3 in its direction of polarization and enters the right-angle prism mirror 5 after passing through the Fourier transform lens 4, whereby Fourier transform of the amplitude distribution of the laser beam Bo is formed on the back focal plane of the Fourier transform lens 4(=the b-plane=the reflecting surface 5A of the right-angle prism mirror 5). By use of the Fourier transform lens 4, the laser beam Bo enters the right-angle prism mirror 5 without loss of light.

The laser beam Bo which enters the right-angle prism mirror 5 is reflected by the reflecting surface 5A of the prism mirror 5. As described above, the edge 5B of the prism mirror 5 is at 45° to the direction parallel to the active layer 7, and accordingly, the amplitude distribution of the laser beam Bo reflected by the reflecting surface 5A of the right-angle prism mirror 5 is inverted by 180° about the edge 5B. That is, the amplitude distribution in the laser beam B1 is inverted by 180° about the edge 5B relative to the amplitude distribution in the laser beam Bo. Further the direction of polarization of the reflected laser beam B1 is equal to that of the laser beam Bo before reflection as described above.

The laser beam B1 reflected by the right-angle prism mirror 5 reenters the Fourier transform lens 4 and is subjected to inverse Fourier transform, whereby the amplitude distribution of the laser beam Bo at the a-plane is imaged again on the a-plane by the Fourier transform lens 4 and the right-angle prism mirror 5. The amplitude distribution of the laser beam B1 at the a-plane is inverted by 180° about the edge 5B relative to the amplitude distribution of the laser beam Bo.

Further since the laser beam B1 passes through the λ/2 plate 3 before imaged on the a-plane, the direction of polarization of the laser beam B1 is parallel to the active layer 7 as described above. Accordingly the laser beam Bo radiated from the semiconductor laser 1 and the laser beam B1 entering the semiconductor laser 1 are equal to each other in the direction of polarization.

The laser beam B1 is caused to form an image on the light outlet end face 1A of the semiconductor laser 1 by the cylindrical lens 2. At this time, since the amplitude distribution of the laser beam B1 is rotated about the edge 5B of the right-angle prism mirror 5 by 180° relative to that of the laser beam Bo, the amplitude distribution controlled to the fundamental transverse mode by the active layer 7 has been made to be an amplitude distribution in the direction parallel to the active layer 7. That is, though the amplitude distribution controlled to the fundamental transverse mode by the active layer 7 in the laser beam Bo radiated from the light outlet end face 1A is an amplitude distribution in the direction perpendicular to the active layer 7, the amplitude distribution in the fundamental transverse mode in the laser beam B1 impinging upon the end face 1A is in the direction parallel to the active layer 7. Further since the beam diameter of the laser beam B1 is unchanged before and after the laser beam B1 passing through the Fourier transform lens 4, the laser beam B1 impinging upon the end face 1A of the semiconductor laser 1 is effectively caused to form an image on the active layer 7.

As can be understood from the description above, in the laser system 100 of this embodiment, the amplitude distribution in the direction parallel to the active layer 7 in the laser beam Bo radiated from the semiconductor laser 1 is forced to be in the fundamental transverse mode when the laser beam Bo is reflected by the resonator mirror optical system 6, and accordingly, amplification and oscillation of high order transverse modes are prevented, whereby only the fundamental transverse mode is amplified and caused to oscillate.

In the case where the laser beam Bo radiated from the semiconductor laser 1 is in a high order transverse mode, the amplitude distribution in the direction parallel to the active layer 7 includes only high order space frequency components. However since the amplitude distribution is rotated by 180° about the edge 5B of the right-angle prism mirror 5 by the resonator mirror optical system 6 and is further subjected to Fourier transform substantially in the direction perpendicular to the active layer 7 by the cylindrical lens 2, the laser beam B1 entering the active layer 7 has an amplitude distribution which is sufficiently wider than the thickness of the active layer 7 in the direction perpendicular to the active layer 7. Accordingly, in the case of the high order transverse modes, loss when the laser beam B1 is introduced into the active layer 7 becomes very large. To the contrast, in the case of the fundamental transverse mode, the laser beam B1 entering the active layer 7 has an amplitude distribution which is substantially equal to the thickness of the active layer 7 in the direction perpendicular to the active layer 7, and is introduced into the active layer 7 substantially without loss. Accordingly, the high order transverse modes are less apt to oscillate and the fundamental transverse mode is more apt to oscillate.

Accordingly, in the laser system of this embodiment, a laser beam including only the fundamental transverse mode can be effectively oscillated and a high quality laser beam can be obtained at a high output power, whereby the radiated laser beam can be condensed to the diffraction limit, and a high power density can be obtained.

Figure 2B:
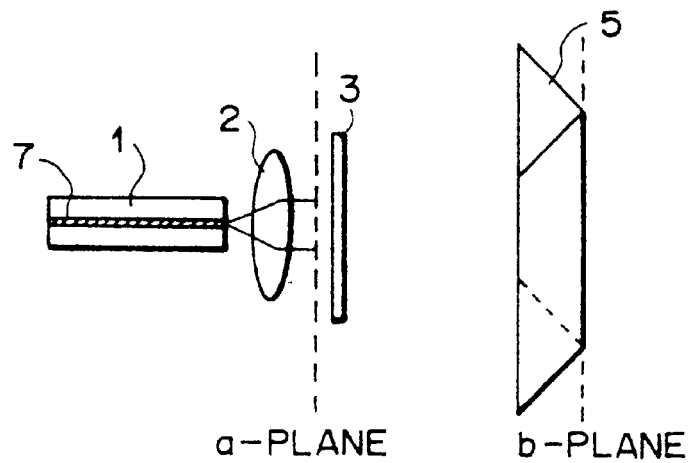
FIG. 2B is a front view of the laser system.

Though, in the first embodiment, the Fourier transform lens 4 is employed, the Fourier transform lens 4 may be omitted as in a second embodiment of the present invention shown in FIGS. 2A to 2C.

A laser system in accordance with a third embodiment of the present invention will be described with reference to FIGS. 3A to 3C, hereinbelow. In FIGS. 3A to 3C, the elements analogous to those shown in FIGS. 1A to 1C are given the same reference numerals and will not be described here.

In FIGS. 3A to 3C, a laser system 100 in accordance with the third embodiment of the present invention comprises a broad-area semiconductor laser 1 as a light source, a collimator lens 30 disposed near the right side light outlet end face 1A of the semiconductor laser 1, a slit 31 which is disposed on a focal point of the collimator lens 30 and cuts the high order components parallel to the active layer 7 in the laser beam Bo collimated by the collimator lens 30, a cylindrical lens 32, a λ/2 plate 3 which rotates the direction of polarization of the laser beam Bo passing through the cylindrical lens 32, and a right-angle prism mirror 5 which is the same as that employed in the first embodiment. The collimator lens 30, the slit 31 and the cylindrical lens 32 form the aforesaid collimator optical system, and the λ/2 plate 3 and the right-angle prism mirror 5 form the resonator mirror optical system 6.

As shown in FIGS. 3A and 3B, the collimator lens 30 collimates divergent components perpendicular to the active layer 7 in the laser beam Bo and converges parallel components parallel to the active layer 7 in the laser beam Bo. The cylindrical lens 32 has power only in the direction parallel to the active layer 7, and as shown in FIG. 3B, only the components of the laser beam Bo passing through the slit 31 which are parallel to the active layer 7 are collimated by the cylindrical lens 32. The focal lengths of the collimator lens 30 and the cylindrical lens 32 are set so that the beam diameters as measured in the direction perpendicular to the active layer 7 and in the direction parallel to the active layer 7 at the reflecting surface 5A of the right-angle prism mirror 5 are substantially equal to each other. Accordingly at the reflecting surface 5A, the laser beam Bo is substantially square in shape.

Also in this embodiment, the amplitude distribution in the direction parallel to the active layer 7 in the laser beam Bo radiated from the semiconductor laser 1 is forced to be in the fundamental transverse mode when the laser beam Bo is reflected by the resonator mirror optical system 6, and accordingly, amplification and oscillation of high order transverse modes are prevented, whereby only the fundamental transverse mode is amplified and caused to oscillate.

A laser system in accordance with a fourth embodiment of the present invention will be described with reference to FIG. 4, hereinbelow. In FIG. 4, the elements analogous to those shown in FIGS. 3A to 3C are given the same reference numerals and will not be described here.

In FIG. 4, a laser system 100 in accordance with the fourth embodiment of the present invention comprises a broad-area semiconductor laser 1 as a light source, a collimator lens 30 disposed near the right side light outlet end face 1A of the semiconductor laser 1, a cylindrical lens 32, a $\lambda/2$ plate 3 which rotates the direction of polarization of the laser beam Bo passing through the cylindrical lens 32, a right-angle prism mirror 5 which is the same as that employed in the first embodiment, a collimator lens 33 disposed near the left side light outlet end face 1B of the semiconductor laser 1, a slit 34 which is disposed on a focal point of the collimator lens 33 and cuts the high order components parallel to the active layer 7 in the laser beam B2 collimated by the collimator lens 33, and a resonator mirror 35 which is disposed on the focal point of the collimator lens 33. The collimator lenses 30 and 33, the slit 34 and the cylindrical lens 32 form the aforesaid collimator optical system, and the $\lambda/2$ plate 3 and the right-angle prism mirror 5 form the resonator mirror optical system 6.

The light outlet end faces 1A and 1B of the semiconductor laser 1 are provided with antireflection coating.

The collimator lenses 30 and 33 collimate divergent components perpendicular to the active layer 7 in the laser beam Bo and converge parallel components parallel to the active layer 7 in the laser beam Bo. The cylindrical lens 32 has power only in the direction parallel to the active layer 7, and only the components of the laser beam Bo passing through the collimator lens 30 which are parallel to the active layer 7 are collimated by the cylindrical lens 32. The focal lengths of the collimator lens 30 and the cylindrical lens 32 are set so that the beam diameters as measured in the direction perpendicular to the active layer 7 and in the direction parallel to the active layer 7 at the reflecting surface 5A of the right-angle prism mirror 5 are substantially equal to each other. Accordingly at the reflecting surface 5A, the laser beam Bo is substantially square in shape.

Also in this embodiment, the amplitude distribution in the direction parallel to the active layer 7 in the laser beam Bo radiated from the semiconductor laser 1 is forced to be in the fundamental transverse mode when the laser beam Bo is reflected by the resonator mirror optical system 6, and accordingly, amplification and oscillation of high order transverse modes are prevented, whereby only the fundamental transverse mode is amplified and caused to oscillate.

In the third and fourth embodiments, a Fourier transform lens may be employed as in the first embodiment.

A laser system in accordance with a fifth embodiment of the present invention will be described with reference to FIGS. 5A to 5C, hereinbelow. In FIGS. 5A to 5C, the elements analogous to those shown in FIGS. 1A to 1C are given the same reference numerals and will not be described here. As can be seen from FIGS. 5A to 5C, the laser system of this embodiment differs from that of the first embodiment in that a pair of prisms 10 and 11 for correcting the beam diameters of the laser beams Bo and B1 are disposed between the cylindrical lens 2 and the $\lambda/2$ plate 3.

That is, the laser beam Bo radiated from the active layer 7 is parallel light in the direction parallel to the active layer 7 and is divergent light in the direction perpendicular to the active layer 7. The active layer 7 is about 100 to 200 $\mu$m in width and about 1 $\mu$m in thickness. In order to collimate the divergent laser beam Bo into a beam having a diameter of 100 to 200 $\mu$m, the cylindrical lens 2 must be very short in focal length. However it is very difficult to produce a cylindrical lens having such a short focal length and such a cylindrical lens is very expensive if it is not impossible to produce such a cylindrical lens.

In the fifth embodiment, the focal length of the cylindrical lens 2 is not so short, and the cylindrical lens 2 collimates the laser beam Bo in the direction perpendicular to the active layer 7 so that the beam diameter as measured in the direction perpendicular to the active layer 7 is larger than that as measured in the direction parallel to the active layer 7. Then the prisms 10 and 11 converge the collimated laser beam Bo in the direction perpendicular to the active layer 7 so that the beam diameter as measured in the direction perpendicular to the active layer 7 becomes substantially equal to that as measured in the direction parallel to the active layer 7.

With this arrangement, the beam diameter as measured in the direction perpendicular to the active layer 7 can be made substantially equal to that as measured in the direction parallel to the active layer 7 without use of an expensive cylindrical lens, whereby the laser system can manufactured at low cost.

Though, in the fifth embodiment, the beam diameter as measured in the direction perpendicular to the active layer 7 is made substantially equal to that as measured in the direction parallel to the active layer 7 by reducing the beam diameter as measured in the direction perpendicular to the active layer 7, the beam diameters may be made equal to each other by enlarging the latter. This can be realized, for instance, by providing between the cylindrical lens 2 and the $\lambda/2$ plate 3 a negative lens which has power only in the direction parallel to the active layer 7 and a cylindrical lens which has power only in the direction parallel to the active layer 7 and collimates the laser beam diverged by the negative lens.

A laser system in accordance with a sixth embodiment of the present invention will be described with reference to FIGS. 6A to 6C, hereinbelow. In FIGS. 6A to 6C, the elements analogous to those shown in FIGS. 1A to 1C are given the same reference numerals and will not be described here. As can be seen from FIGS. 6A to 6C, the laser system of this embodiment differs from that of the first embodiment in that the cylindrical lens 2 has a focal length equal to that of the cylindrical lens in the fifth embodiment and an in-mirror type Fourier transform lens 14 is employed as the Fourier transform lens. In this embodiment, the beam diameter of the laser beam Bo as measured in the direction perpendicular to the active layer 7 differs from that as measured in the direction parallel to the active layer 7.

Figure 8:
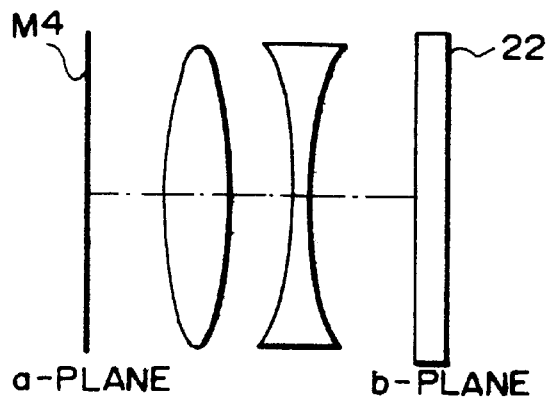
FIG. 8 is a view showing an in-mirror type Fourier transform lens.

FIG. 7 shows a symmetric Fourier transform lens on the basis of which the in-mirror type Fourier transform lens shown in FIG. 8 is explained. There has been known a symmetric Fourier transform lens comprising a pair of lens groups 20 and 21, each consisting of a concave lens and a convex lens, which are arranged symmetrically with respect to an axis of symmetry Mo so that the distance between the axis of symmetry Mo and the front focal plane M1 is equal to the distance between the axis of symmetry Mo and the back focal plane (Fourier transform plane) M2 as shown in FIG. 7. An in-mirror type Fourier transform lens which is equivalent to the symmetric Fourier transform lens shown in FIG. 7 can be formed by dividing the symmetric Fourier transform lens into two parts at the axis of symmetry Mo and providing a mirror 22 in the position of the axis of symmetry Mo with respect to one of the two parts as shown in FIG. 8. In the in-mirror type Fourier transform lens shown in FIG. 8, the focal plane M4 doubles the front focal plane and the back focal plane (Fourier transform plane) of the Fourier transform lens. In the laser system shown in FIG. 6, the a-plane corresponds to the focal plane M4, the right-angle prism mirror 5 functions as the mirror 22, and the reflecting surface 5A of the prism mirror 5, i.e., the b-plane corresponds to the reflecting surface of the mirror 22.

In the sixth embodiment, the focal length f of the in-mirror type Fourier transform lens 14 is set to satisfy the condition represented by the following formula (1).

$$D1 \times D2 = K \times \lambda \times f \quad (1)$$

wherein D1 represents the beam diameter at the a-plane of the laser beam Bo impinging upon the lens 14 as measured in the direction perpendicular to the active layer 7, D2 represents the beam diameter at the a-plane of the laser beam Bo impinging upon the lens 14 as measured in the direction parallel to the active layer 7 (a value when the laser beam Bo oscillates in the fundamental transverse mode in the direction parallel to the active layer 7), K is a constant of proportionality determined depending on the shape of the beam, the aperture of the lens and the like, $\lambda$ represents the wavelength of the laser beam, and f represents the focal length.

Figure 9A:
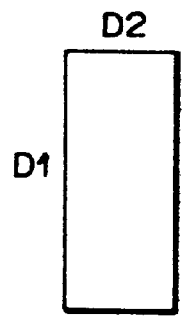
FIGS. 9A to 9C are views showing the beam diameters before and after Fourier transform in the sixth embodiment.
Figure 9B:
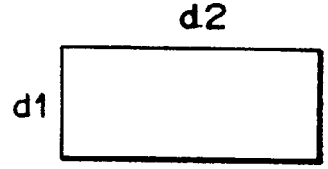
Figure 9C:
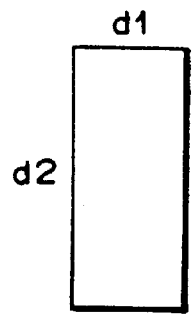

Change in beam diameter by the in-mirror type Fourier transform lens 14 will be described with reference to FIGS. 9A to 9C, hereinbelow. In FIGS. 9A to 9C, it is assumed that the vertical direction is the direction perpendicular to the active layer 7 and the horizontal direction is the direction parallel to the active layer 7. When it is assumed that the shape at the a-plane of the laser beam Bo before Fourier transform is like a rectangle of D1×D2 with its longer sides extending in the direction perpendicular to the active layer 7 as shown in FIG. 9A, the shape at the a-plane of the laser beam B1 after Fourier transform by the in-mirror type Fourier transform lens 14 is like a rectangle d1×d2 with its longer sides extending in the direction parallel to the active layer 7 as shown in FIG. 9B. That is, the rectangle shown in FIG. 9B is obtained by rotating the rectangle shown in FIG. 9A by 90°. In the sixth embodiment shown in FIG. 6, since the right-angle prism mirror 5 is employed as the mirror 22 for the in-mirror type Fourier transform lens 14, the shape of the laser beam is rotated by 180° about the edge 5B of the prism mirror 5 and the shape at the a-plane of the laser beam B1 after Fourier transform by the in-mirror type Fourier transform lens 14 is like a rectangle d1×d2 with its longer sides extending in the direction perpendicular to the active layer 7 as shown in FIG. 9C.

The relation between the beam diameters D1 and D2 before Fourier transform and those d1 and d2 after Fourier transform is as follows.

$$d1 = (K \times \lambda \times f)/D1 \quad (2)$$

$$d2 = (K \times \lambda \times f)/D2 \quad (3)$$

Formula (1) can be converted as follows.

$$D2 = (K \times \lambda \times f)/D1 \quad (4)$$

$$D1 = (K \times \lambda \times f)/D2 \quad (5)$$

Accordingly, d1=D2 d2=D1

That is, the beam diameters of the laser beam Bo before Fourier transform are equal to those of the laser beam B1 after Fourier transform by the in-mirror type Fourier transform lens 14. Accordingly, by arranging the in-mirror type Fourier transform lens 14 to satisfy the condition represented by formula (1), the beam diameters at the a-plane of the laser beam Bo as radiated from the broad-area semiconductor laser 1 can be equalized to those of the laser beam B1 entering the semiconductor laser 1.

Further since the amplitude distribution which is controlled to the fundamental transverse mode in the direction perpendicular to the active layer 7 is rotated by 180° about the edge 5B of the right-angle prism mirror 5 and is converted to an amplitude distribution which is controlled to the fundamental transverse mode in the direction parallel to the active layer 7 as in the first to fifth embodiments. Accordingly, a laser beam including only the fundamental transverse mode can be effectively oscillated and a high quality laser beam can be obtained at a high output power, whereby the radiated laser beam can be condensed to the diffraction limit and a high power density can be obtained.

In the sixth embodiment, a collimator lens may be employed in place of the cylindrical lens 2.

A laser system in accordance with a seventh embodiment of the present invention will be described with reference to FIGS. 10A to 10C, hereinbelow. In FIGS. 10A to 10C, the elements analogous to those shown in FIGS. 1A to 1C are given the same reference numerals and will not be described here.

In FIGS. 10A to 10C, a laser system 100 in accordance with the seventh embodiment of the present invention comprises a broad-area semiconductor laser 1 as a light source, a collimator optical system including a collimator lens 40 disposed near the right side light outlet end face 1A of the semiconductor laser 1, a slit 41 which is disposed on a focal point of the collimator lens 40 and cuts the high order components parallel to the active layer 7 in the laser beam Bo collimated by the collimator lens 40, and a cylindrical lens 42, and a resonator mirror optical system 6 which includes a cylindrical lens 43 and a resonator mirror 44 and reflects at a predetermined reflectance the laser beam Bo passing through the cylindrical lens 42 while rotating amplitude distribution of the reflected laser beam Bi by 180° about an axis which is at 90° to the optical axis X and at 45° to a normal of the active layer 7. The collimator optical system formed by the collimator lens 40, the slit 41 and the cylindrical lens 42 are equivalent to the collimator optical system employed in the third embodiment.

As shown in FIGS. 10A and 10B, the collimator lens 40 collimates divergent components perpendicular to the active layer 7 in the laser beam Bo and converges parallel components parallel to the active layer 7 in the laser beam Bo. The cylindrical lens 42 has power only in the direction parallel to the active layer 7, and as shown in FIG. 10A, only the components of the laser beam Bo passing through the slit 41 which are parallel to the active layer 7 are collimated by the cylindrical lens 42. The focal lengths of the collimator lens 40 and the cylindrical lens 42 are set so that the beam diameters as measured in the direction perpendicular to the active layer 7 and in the direction parallel to the active layer 7 of the laser beam Bo as emanating from the cylindrical lens 42 are substantially equal to each other. Accordingly, the laser beam Bo emanating from the cylindrical lens 42 and the leaser beam B1 entering the cylindrical lens 42 are both substantially square in shape.

The resonator mirror 44 has a reflecting surface 44A provided with coating which is relatively high in reflectance.

The cylindrical lens 43 is disposed with its longer axis 43A inclined at 45° to the direction parallel to the active layer 7 and has power in the direction inclined at 45° to the direction parallel to the active layer 7. The components in the laser beam Bo passing through the cylindrical lens 42 which are at 45° to the active layer 7 are focused on the reflecting surface 44A of the resonator mirror 44 and reflected by the reflector mirror 44 while being rotated by 180° about the longer axis 43A of the cylindrical lens 43. Accordingly, the amplitude distributions in the directions parallel and perpendicular to the active layer 7 in the reflected laser beam B1 respectively correspond to those in the directions perpendicular and parallel to the active layer 7 in the laser beam Bo.

The operation of the laser system 100 of the seventh embodiment will be described hereinbelow.

The laser beam Bo radiated from the AR-coated light outlet end face 1A of the broad-area semiconductor laser 1 is controlled so that the amplitude distribution in the direction perpendicular to the active layer is in the fundamental transverse mode. Further the laser beam Bo is parallel light in the direction parallel to the active layer 7 and is divergent light in the direction perpendicular to the active layer 7. The the beam diameters of the laser beam Bo as measured in the directions parallel and perpendicular to the active layer 7 are made to be equal to each other by the collimator lens 40 and the cylindrical lens 42. Accordingly, the beam diameters as measured in the direction perpendicular to the active layer 7 and in the direction parallel to the active layer 7 of the laser beam Bo as emanating from the cylindrical lens 42 are substantially equal to each other. The laser beam Bo thus shaped enters the cylindrical lens 43.

The laser beam Bo which enters the cylindrical lens 43 is caused to form an image on the reflecting surface 44A of the resonator mirror 44 and is reflected by the reflecting surface 44A. Since the longer axis 43A of the cylindrical lens 43 is at 45° to the direction parallel to the active layer 7, the amplitude distribution of the laser beam Bo is inverted by 180° about the longer axis 43A. Further the direction of polarization of the reflected laser beam B1 is equal to that of the laser beam Bo before reflection as described above.

The components of the laser beam B1 reflected by the resonator mirror 44 which are at 45° to the direction parallel to the active layer 7 are collimated by the cylindrical lens 43, and accordingly the laser beam B1 entering the cylindrical lens 42 has the same diameter in the direction perpendicular to the active layer 7 and in the direction parallel to the active layer 7. Further the amplitude distributions of the laser beam B1 in the directions parallel and perpendicular to the active layer 7 respectively correspond to those of the laser beam Bo in the directions perpendicular and parallel to the active layer 7.

The laser beam B1 is caused to form an image on the light outlet end face 1A of the semiconductor laser 1 by the cylindrical lens 42 and the collimator leans 40. At this time, the amplitude distribution controlled to the fundamental transverse mode by the active layer 7 has been made to be an amplitude distribution in the direction parallel to the active layer 7. That is, though the amplitude distribution controlled to the fundamental transverse mode by the active layer 7 in the laser beam Bo radiated from the light outlet end face 1A is an amplitude distribution in the direction perpendicular to the active layer 7, the amplitude distribution in the fundamental transverse mode in the laser beam B1 impinging upon the end face 1A is in the direction parallel to the active layer 7. Further since the beam diameter of the laser beam B1 is unchanged before and after the laser beam B1 passing through the Fourier transform lens 4, the laser beam B1 impinging upon the end face 1A of the semiconductor laser 1 is effectively caused to form an image on the active layer 7.

As can be understood from the description above, in the laser system 100 of this embodiment, the amplitude distribution in the direction parallel to the active layer 7 in the laser beam Bo radiated from the semiconductor laser 1 is forced to be in the fundamental transverse mode when the laser beam Bo is reflected by the resonator mirror optical system 6, and accordingly, amplification and oscillation of high order transverse modes are prevented, whereby only the fundamental transverse mode is amplified and caused to oscillate.

In the seventh embodiment, a Fourier transform lens may be employed as in the first embodiment.

Though, in the seventh embodiment, the collimator lens system is formed by a collimator lens 40, a slit 41 and a cylindrical lens 42 as in the third embodiment, the collimator lens system is may be formed as in the first, fourth, fifth or sixth embodiment.

Further, though in the first to seventh embodiments, the resonator mirror optical system 6 is disposed on the side of the right side light outlet end face 1A of the broad-area semiconductor laser 1 with the left side light outlet end face 1B of the semiconductor laser 1 provided with a LR coating, a resonator mirror optical system similar to that employed in one of the first to seventh embodiments may be provided also on the side of the left side light outlet end face 1B of the semiconductor laser 1 instead of providing the end face 1B with a LR coating.

Further, though, in the first, fifth and sixth embodiments, a Fourier transform lens is employed in order to prevent loss of the laser beams Bo and B1, a collimator lens may be employed in place of the Fourier transform lens.

What is claimed is:

1. A laser system comprising
    a light amplifier medium provided with an optical waveguide layer which controls the transverse mode to a fundamental transverse mode in one direction,
    a first resonator mirror optical system which is opposed to a first light outlet end face of the light amplifier medium and reflects a laser beam radiated from the first light outlet end face to impinge upon the first light outlet end face, and a second resonator mirror optical system which is opposed to a second light outlet end face of the light amplifier medium and reflects a laser beam radiated from the second light outlet end face to impinge upon the second light outlet end face, wherein the improvement comprises that at least one of the first and second resonator mirror optical system comprises a collimator optical system which collimates the amplitude distribution in the laser beam radiated from the corresponding light output end face of the light amplifier medium at least in a direction substantially perpendicular to the optical waveguide layer, and a reflecting optical system which converts amplitude distribution in the direction substantially perpendicular to the optical waveguide layer in the collimated laser beam to amplitude distribution in a direction substantially parallel to the optical waveguide layer and reflects the laser beam.

2. A laser system as defined in claim 1 in which the reflecting optical system comprises an inverting mirror optical system which reflects the laser beam collimated by the collimator optical system with its amplitude distribution inverted substantially by 180° about an axis which is substantially at 90° to the optical axis of the laser beam and at 45° to a normal of the optical waveguide layer.

3. A laser system as defined in claim 2 in which the inverting mirror optical system comprises a λ/2 plate which makes the direction of polarization of the laser beam as radiated from the light amplifier medium substantially equal to that of the laser beam entering the light amplifier medium, and a right-angle prism mirror which reflects the laser beam collimated by the collimator optical system with its amplitude distribution inverted substantially by 180° about an axis which is substantially at 90° to the optical axis of the laser beam and at 45° to a normal of the optical waveguide layer.

4. A laser system as defined in claim 2 in which the inverting mirror optical system comprises a λ/2 plate which makes the direction of polarization of the laser beam as radiated from the light amplifier medium substantially equal to that of the laser beam entering the light amplifier medium, a Fourier transform lens which subjects the laser beam collimated by the collimator optical system to Fourier transform, and a right-angle prism mirror which reflects the laser beam subjected to the Fourier transform by the Fourier transform lens with its amplitude distribution inverted substantially by 180° about an axis which is substantially at 90° to the optical axis of the laser beam and at 45° to a normal of the optical waveguide layer.

5. A laser system as defined in claim 4 in which the Fourier transform lens is an in-mirror type Fourier transform lens whose focal length f satisfies the condition represented by the following formula;

$$D1 \times D2 = K \times \lambda \times f$$

wherein D1 represents the beam diameter of the laser beam at a focal plane of the in-mirror type Fourier transform lens as measured in the direction perpendicular to the optical waveguide layer, D2 represents the beam diameter of the laser beam at the focal plane of the in-mirror type Fourier transform lens as measured in the direction parallel to the optical waveguide layer, K is a constant of proportionality determined depending on the shape of the beam, the aperture of the lens and the like, λ represents the wavelength of the laser beam, and f represents the focal length.

6. A laser system as defined in claim 2 in which the inverting mirror optical system comprises a cylindrical lens having power in the direction substantially at 45° to a normal of the optical waveguide layer, and a mirror disposed near the focal point of the cylindrical lens.

7. A laser system as defined in claim 2 in which the inverting mirror optical system comprises a Fourier transform lens which subjects the laser beam collimated by the collimator optical system to Fourier transform, a cylindrical lens having power in the direction substantially at 45° to a normal of the optical waveguide layer, and a mirror disposed near the focal point of the cylindrical lens.

8. A laser system as defined in claim 7 in which the Fourier transform lens is an in-mirror type Fourier transform lens whose focal length f satisfies the condition represented by the following formula;

$$D1 \times D2 = K \times \lambda \times f$$

wherein D1 represents the beam diameter of the laser beam at a focal plane of the in-mirror type Fourier transform lens as measured in the direction perpendicular to the optical waveguide layer, D2 represents the beam diameter of the laser beam at the focal plane of the in-mirror type Fourier transform lens as measured in the direction parallel to the optical waveguide layer, K is a constant of proportionality determined depending on the shape of the beam, the aperture of the lens and the like, λ represents the wavelength of the laser beam, and f represents the focal length.

* * * * *